United States Patent
Ohtsuki et al.

(10) Patent No.: US 7,384,270 B2
(45) Date of Patent: Jun. 10, 2008

(54) ELECTRICAL CONNECTOR

(75) Inventors: Tomonari Ohtsuki, Tokyo (JP); Yasue Yamazaki, Tokyo (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 09/975,114

(22) Filed: Oct. 11, 2001

(65) Prior Publication Data

US 2002/0045366 A1   Apr. 18, 2002

(30) Foreign Application Priority Data

Oct. 18, 2000   (JP)   ............................. 2000-317538
May 10, 2001   (JP)   ............................. 2001-139680

(51) Int. Cl.
    *H01R 12/00*   (2006.01)
(52) U.S. Cl. ....................................................... 439/66
(58) Field of Classification Search ................. 439/67, 439/66
    See application file for complete search history.

(56) References Cited

U.S. PATENT DOCUMENTS

| | | | | |
|---|---|---|---|---|
| 5,914,613 | A * | 6/1999 | Gleason et al. | 324/754 |
| 5,984,691 | A | 11/1999 | Brodsky et al. | 439/66 |
| 6,027,346 | A * | 2/2000 | Sinsheimer et al. | 439/66 |

FOREIGN PATENT DOCUMENTS

| JP | 61-104648 | 5/1986 |
|---|---|---|
| JP | 08-078110 | 3/1996 |
| JP | 08-162238 | 6/1996 |
| JP | 11-135217 | 5/1999 |
| JP | 11-219767 | 8/1999 |
| JP | 2000-082521 | 3/2000 |

* cited by examiner

*Primary Examiner*—Khiem Nguyen
(74) *Attorney, Agent, or Firm*—Baker Botts LLP (57) ABSTRACT

An electrical connector for connecting oppositely arranged first and second mating electrical devices includes a support member, a first circuit having a plurality of electric contact elements arranged on one surface of the support member to contact electric contacts of the first mating electrical device, a second circuit having a plurality of electric contact elements arranged on the other surface of the support member to contact electric contacts of the second mating electrical device, and conductors connecting the first and second circuits. The electric contact elements of the first and second circuits are formed in the most suitable manner to meet the shapes of the mating electric contacts, respectively. The support member is formed through its thickness with slits closely around the electric contact elements, respectively. As a result, when the electric contacts of the first mating electrical device urge the electric contact elements arranged on the support member to deform the support member, the electric contacts slide on the electric contact elements, thereby removing solders adhered on the electric contact elements. The slits are arranged at random to be directed substantially in different directions so that horizontal forces caused by the urging forces of the electric contacts of the first mating electrical device are canceled out each other, thereby maintaining the axial alignment of the first mating electrical device with the electrical connector.

7 Claims, 11 Drawing Sheets

FIG. 12
PRIOR ART

ELECTRICAL CONNECTOR

BACKGROUND OF THE INVENTION

This invention relates to an electrical connector for connecting oppositely arranged first and second mating electrical means, comprising a support member, a first circuit having a plurality of electric contact elements arranged on one surface of the support member to contact electric contacts of the first mating electrical means, a second circuit having a plurality of electric contact elements arranged on the other surface of the support member to contact electric contacts of the second mating electrical means, and conductors connecting the first and second circuits, and more particularly to an electrical connector capable of removing solders adhered to electric contact elements from mating electric contacts, while limiting the sliding movement of the mating electric contacts.

In order to inspect the performance of a ball grid array connector having a plurality of electric contacts in the form of a hemispherical protrusion made of solder or the like, a socket connector has been used, which is detachably fitted with the ball grid array connector. In such inspections, the electrical contact between electric contacts of the two connectors amounts often to several thousand times or more. As a result, the solder forming the electric contacts of the ball grid array connector tends to adhere to the electric contact elements of the socket connector, causing defective or failed electrical connection therebetween.

Owing to such an adherence of the solder to the electric contact elements of the socket connector, removal of the adhered solder therefrom is needed by the use of a brush every several hundred times or thousand times of the contact between the electric contacts and the electric contact elements. However, the removal of the adhered solder by brushing is not an easy matter if not impossible. Earlier use of the brush would make it easy to remove the adhered solder. However, it would increase the number of time of the brushing operation, which would also increase the man-hour of the operation of the electrical connector, resulting in increased cost of operation.

There is disclosed in U.S. Pat. No. 5,984,691 an electric contact element of an electrical connector, having the dendritic structure at its surface. According to its explanation the dendritic structure serves only to enhance the electrical connection. The dendritic structure does not contribute to removal of adhered solder on the mating electric contacts.

In the U.S. Pat. No. 5,984,691, there is also disclosed the interposer comprising the support member, apertured members arranged on its upper and lower surfaces and the flexible circuitized substrates further arranged on the upper and lower surfaces of the apertured members and supporting the conductors or electric contact elements. With this construction, when a force is applied to the conductors or electric contact elements, the circuitized substrate is depressed within the aperture of the apertured member. In the preamble of the specification of the U.S. Pat. No. 5,984,691, there are described that when a force is applied to the conductive elastomer elements, the resistivity of such conductive elastomer elements will be varied, that when the flexible circuit is subjected to a cyclic stress, it will shorten the fatigue life of the circuit lines on the flexible circuit, thereby possibly resulting in a failed connection, and that if the various components in the system are poor in compressibility, they could not accommodate their manufacturing tolerances. In order to overcome these problems, the invention of the U.S. Pat. No. 5,984,691 proposed the elastic support member. It is clear, however, that this proposal does not have the purpose of removing adhered solder.

As can be seen from FIG. 1 of the U.S. Pat. No. 5,984,691, electric contacts arranged on the upper and lower surfaces of the support member are similar in shape to one another. However, there is need to change the shapes of the upper and lower contacts in the most suitable manner depending upon the shapes of mating contacts and their applications.

In manufacturing, moreover, it is needed to investigate microstrip lines in consideration of characteristics as transmission lines preferable for measurements. In reality, however, it is very difficult to investigate the microstrip lines.

As described above, there is a hitherto used electrical connector comprising a ball grid array connector (first connector) and a socket connector (second connector) which are brought into detachable abutment against one another to electrically connect a plurality of electric contacts made of solder in the form of a hemispherical protrusion provided on one surface of the first connector and a plurality of electric contact elements provided on one surface of the second connector. In such a construction, the electric contacts of the first connector arranged with an interval of 0.8 mm are as little as about 0.2 mm in diameter. The narrower the interval or pitch of the electric contacts, the narrower will become contacting areas with the mating contact elements. Therefore, a CCD (charge-coupled device) camera is commonly used to bring the electric contacts of the first connector and the electric contact elements of the second connector into alignment with one another.

Figure 10:
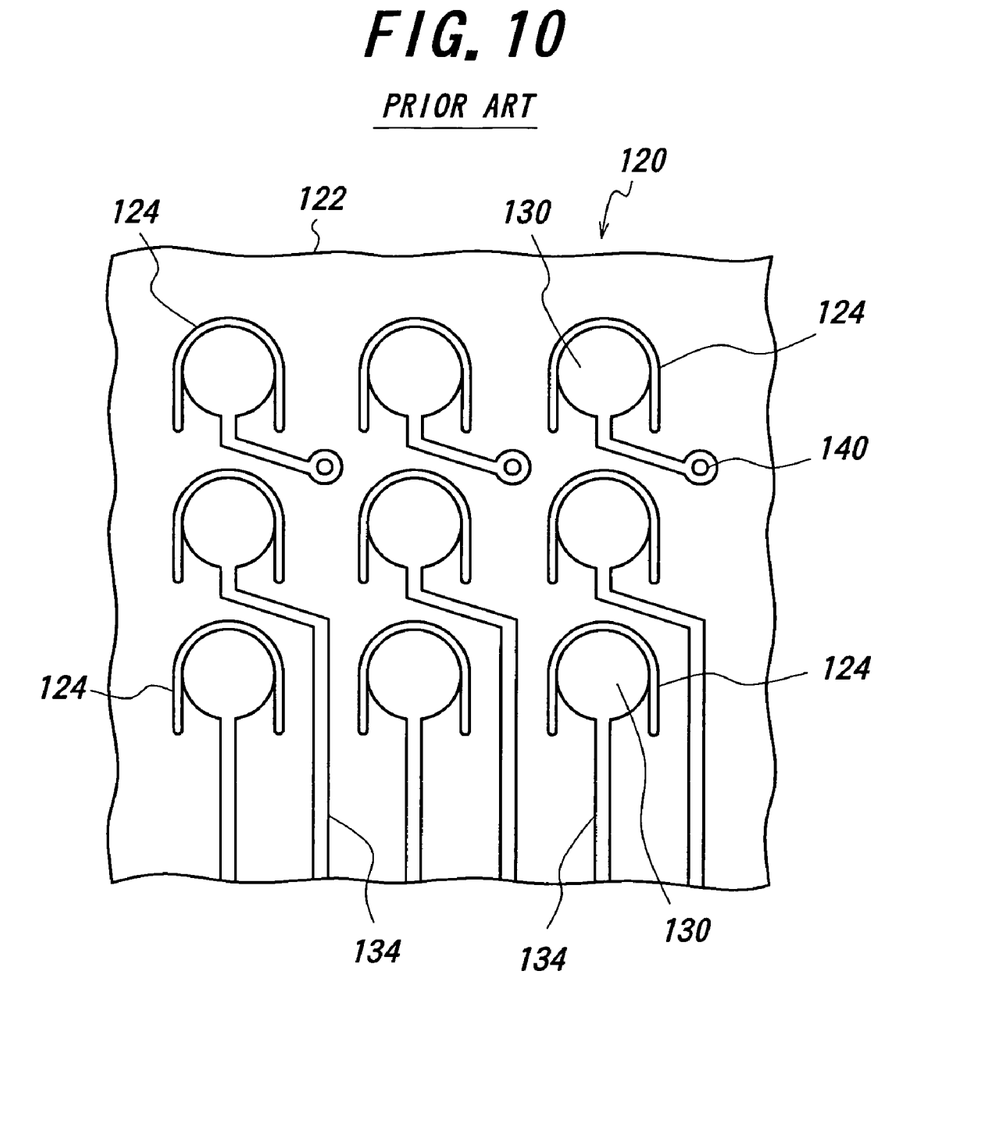
FIG. 10 is a partly enlarged plan view of the substrate of the second connector of the prior art.
Figure 12:
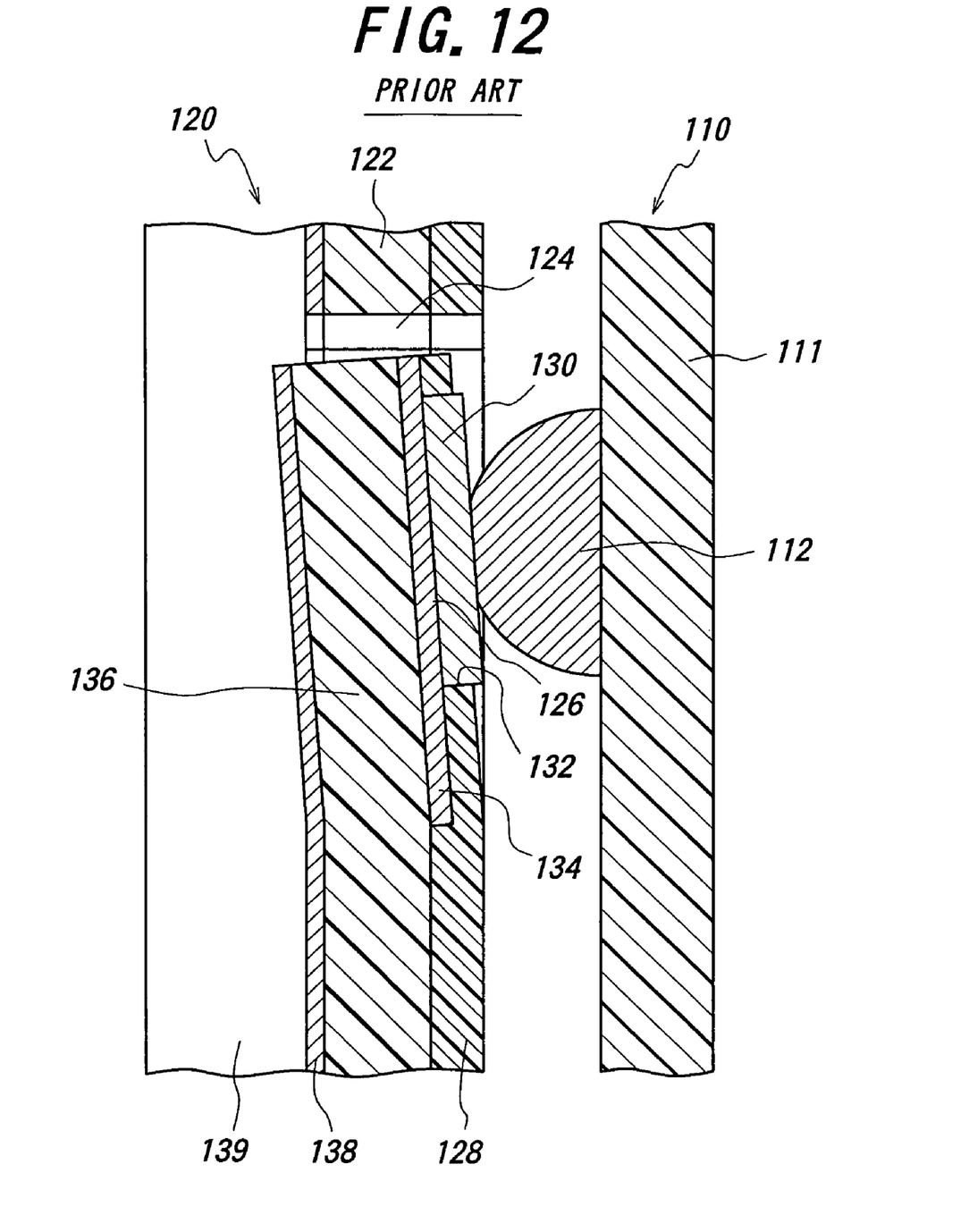
FIG. 12 is a partly enlarged longitudinal sectional view of the electrical connector of the prior art illustrating one electric contact urging and sliding on one electric contact element.

As shown in FIGS. 10 and 12, the first connector 110 includes a connector plate 111 made of a ceramic or hard resin substrate or board having a rigidity, on one surface of which are provided a plurality of electric contacts 112 of solder (Pb and Sn) in the form of a hemispherical protrusion. These electric contacts 112 are formed by reflow-soldering of solder balls arranged on lands of a hard resin board.

The second connector 120 includes a plurality of electric contact elements 130 adapted to contact the electric contacts 112 of the first connector 110. These electric contact elements 130 are provided on conductors 126 provided on one surface of a substrate 122 or flexible printed board or the like which is formed with slits 124 around the conductors 126, thereby making flexible the parts of the substrate and the conductors surrounded by the slits 124. With this construction, the elastic support of the electric contact elements accommodates any differences in height between the electric contacts 112 of the first connector 110. The electric contact elements 112 are in general treated with a surface treatment such as nickel or gold plating because they are electrically contacting portions.

Figure 11A:
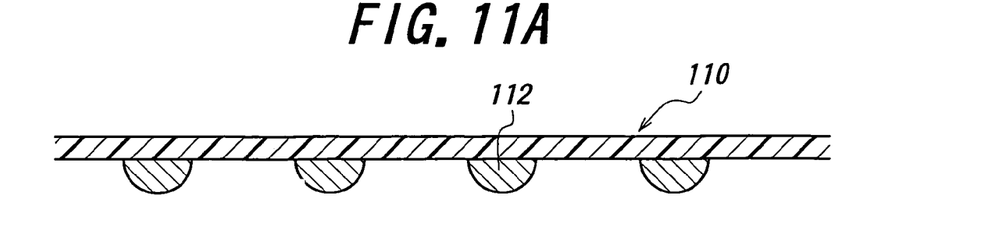
FIG. 11A is a partly enlarged sectional view of the first connector for explaining the force acting thereon.
Figure 11B:
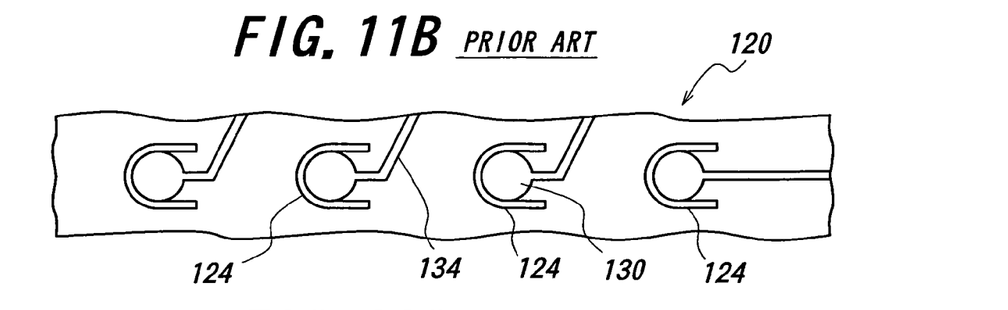
FIG. 11B is a partly enlarged plan view of the second connector of the prior art.
Figure 11C:
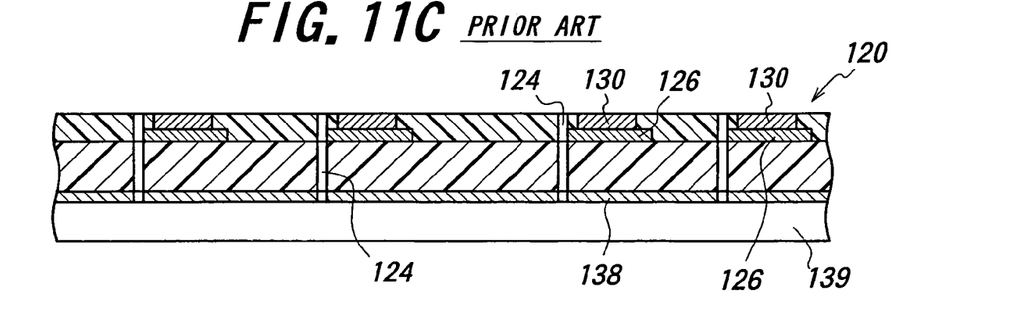
FIG. 11C is a partly enlarged sectional view of the second connector shown in FIG. 11B.
Figure 11D:
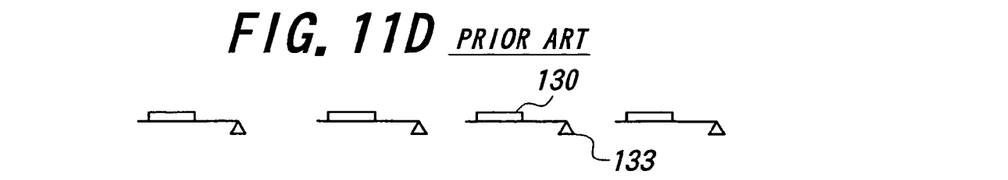
FIG. 11D is a schematic pictorial view of the electric contact elements in FIG. 11C.
Figure 11E:
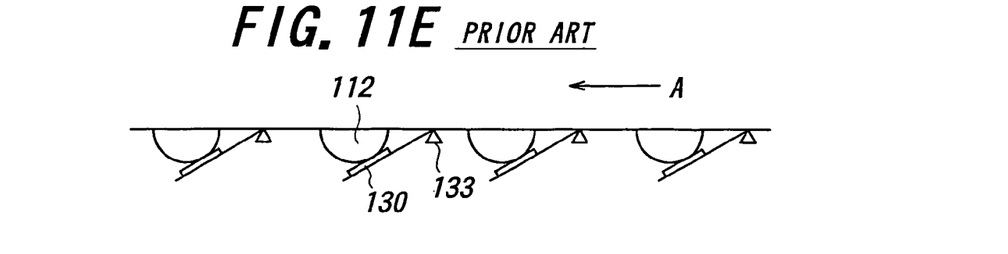
FIG. 11E is a schematic pictorial view illustrating electric contact elements shown in FIG. 11D which have been moved downward by the electric contacts.

FIG. 11A illustrates part of such a first connector 110 including four electric contacts, and FIG. 11B shows part of the second connector 120 in opposition to the part of the first connector 110, whose slits 124 are directed in the same direction. FIG. 11C is a cross-sectional view of the part of the second connector 120 shown in FIG. 11B. FIG. 11D schematically illustrates the electric contact elements 130 supported in the cantilevered manner before urged. FIG. 11E schematically illustrates the electric contact elements 130 urged downward by the electric contacts 112. As shown in FIG. 11E, in the case of the arrangement of the slits 124 directed in the same direction, the electric contacts 112 of the first connector 110 are subjected to horizontal direction shown by an arrow A owing to the horizontal components of the reaction forces caused by the parts of the substrate and the conductors surrounded by the slits 124 of the second connector 120, as a result of which the first connector 110 is subjected to the horizontal force shown by the arrow A. Consequently, the distance of the sliding movement of the electric contacts 112 of the first connector 110 increases although the first connector 110 is guided to prevent it from wobbling in the direction A by a plug and socket mechanism.

In the case of 70% or more of the slits 124 directed in the same direction, it would be difficult to restrain the distance of sliding movement of the electric contacts 112 of the first connector 110, so that contacting positions between the electric contacts 112 of the first connector 110 and the electric contact elements 130 of the second connector 120 would irregularly vary, resulting in unstable contact between the electric contacts 112 and the electric contact elements 130.

With the slits 124 in excess of 70% directed in the same direction, the first connector 110 is further moved by the force shown by the arrow A in FIG. 11E in addition to the sliding movement of the electric contacts 112 although the first connector 110 is guided by the plug and socket mechanism. As described above, the range of contact between the electric contacts 112 and the electric contact elements 130 is very narrow, so that the contact therebetween comes out of the range, with the result of defective or failed electrical connection.

If the slits 124 are directed substantially in the same direction, the distance of the sliding movement of the electric contacts on the electric contact elements would excessively increase, causing excess wear of the contacting portions therebetween.

SUMMARY OF THE INVENTION

It is an object of the invention to provide an electrical connector which eliminates all the disadvantages of the prior art and which has electric contact elements on both sides different in shape in the most suitable manner depending upon applications and prevents solder of, for example, a ball grid array connector from adhering even in repeated contacts of several thousand times or more to ensure the stable electrical connection without requiring any investigation of microstrip lines in consideration of characteristics of transmission lines.

It is a further object of the invention to provide an electrical connector having first and second connectors, capable of maintaining the alignment of the two connectors in the connecting direction, with a resultant stable electrical connection therebetween.

In order to accomplish the first object, in an electrical connector for connecting oppositely arranged first and second electrical means, comprising a support member, a first circuit having a plurality of electric contact elements arranged on one surface of said support member to contact electric contacts of said first mating electrical means, a second circuit having a plurality of electric contact elements arranged on the other surface of the support member to contact electric contacts of said second mating electrical means, and conductors connecting said first and second circuits, according to the invention, said electric contact elements of the first and second circuits are formed in the most suitable manner to meet the shapes of the mating electric contacts, respectively.

The expression "the most suitable manner" used herein means that shapes of electric contact elements are most preferably adapted to contact respective electric contacts of the first and second electrical means depending upon the shapes of these electric contacts. For example, if the mating contacts are ball grid array, the electric contact elements are shaped to have at their surfaces ridges having triangular cross-sections, and if the mating contacts are flat pads, the electric contact elements are in the form of a hemispherical protrusion.

Preferably, when the first mating electrical means is a ball grid array connector and the second mating electrical means is a printed circuit board, the electric contact elements of the first circuit are each provided on its surface with at least one ridge having a triangular cross-section and the electric contact elements of the second circuit are hemispherical protrusions, thereby making the surfaces of the first and second circuits different in shape. It is preferable that each of the electric contact elements to contact the electric contacts of the first mating electrical means is formed by plating together with the at least one ridge.

In a preferred embodiment, the at least one ridge of each of the electric contact elements is formed to extend in a direction substantially parallel to the direction in which the electric contact of the first mating electrical means slides on the electric contact element upon being displaced in the urged direction by the electric contact when the electric contact contacts and urges the electric contact element in the urged direction.

Preferably, the support member is formed through its thickness with slits closely around the electric contact elements which contact the electric contacts of the first mating electrical means, respectively. As an alternative, the support member is made of a non-rigid resin capable of being elastically deformed.

In one embodiment, the support member is made of a composite body comprising an elastomeric resin material and a metal spring. Alternatively, the support member is composed of a plurality of support element members to form spaces therebetween, thereby more facilitating the deformation of the support member as a whole. In another embodiment, the support member is formed with at least one aperture parallel to or perpendicular to the surfaces of the support member provided with the first and second circuits, thereby more facilitating the deformation of the support member.

According to the invention, an electrically connecting length through a conductor between each of the electric contact elements of the first circuit on the surface of the support member and the corresponding electric contact element of the second circuit on the other surface of the support member is less than 5 mm.

In order to accomplish the second object, according to a preferred embodiment of the invention, the slits are arranged at random to be directed substantially in different directions.

With this arrangement, the first and second connectors maintain their initially contacting positions, while increasing their contacting distances in the connecting direction, thereby controlling the sliding movement of the electric contacts of the first connector.

The electrical connector according to the invention has the following significant effects.

(1) In the electrical connector according to the invention electric contacts on one surface are electric contact elements each having at least one ridge having the triangular cross-section, while electric contacts on the other surface are hemispherical protrusions different from the electric contact elements to accomplish the most suitable shapes of the electric contacts depending upon applications.

(2) According to the invention, at least one ridge having a triangular cross-section extending parallel to the sliding movement of the mating electric contact is provided on the electric contact element, so that in repeated electrical connection therebetween, a stable connection can be achieved without adherence of the solder of the mating electric contact to the electric contact element without causing any unstable electrical connection and any unstable measurement of contacting resistance therebetween.

(3) The electrical connector according to the invention is able to prevent the solder of the mating electric contacts from adhering to the electric contact elements, so that there is no need to remove adhered solder by a brush, thereby improving the operating efficiency without lowing the efficiency due to brushing operation.

(4) According to the invention an electrically connecting length through a conductor between each of the electric contact elements of the first circuit on the surface of the support member and the corresponding electric contact element of the second circuit on the other surface of the support member is less than 5 mm. Therefore, any particular caution is not required in measurement and inspection, with the result that there is no need to investigate microstrip lines in consideration of characteristics as transmission lines, thereby contributing to lower cost.

(5) With the slits arranged at random to be directed substantially in different directions according to the invention, when the contacting depths between the first and second connectors increase in the urging direction, the initially contacting positions or contact starting positions are maintained, thereby limiting the distance of the sliding movement of the electric contacts of the first connector to a certain value.

(6) With the slits arranged at random according to the invention in addition to the guiding of the plug and socket mechanism for the first and second connectors, the center axes of the two connectors are kept in alignment with each other without any lateral movement of the first connector relative to the second connector in spite of the sliding movement of the electric contacts of the first connector on the electric contact elements of the second connector. In other words, the sliding distance of the electric contacts on the electric contact elements is limited only to that corresponding to the urged distance of the electric contact elements.

(7) According to the invention when the first and second connectors are fitted with each other, the distance of the sliding movement of the electric contacts of the first connector on the electric contact elements of the second connector can be limited to a certain value, thereby obtaining stable electrical connection between two connectors.

(8) As the number of circuits increases, it becomes much easier to arrange the slits at random in a more suitable manner.

The invention will be more fully understood by referring to the following detailed specification and claims taken in connection with the appended drawings.

DESCRIPTION OF THE PREFERRED EMBODIMENTS

Figure 1:
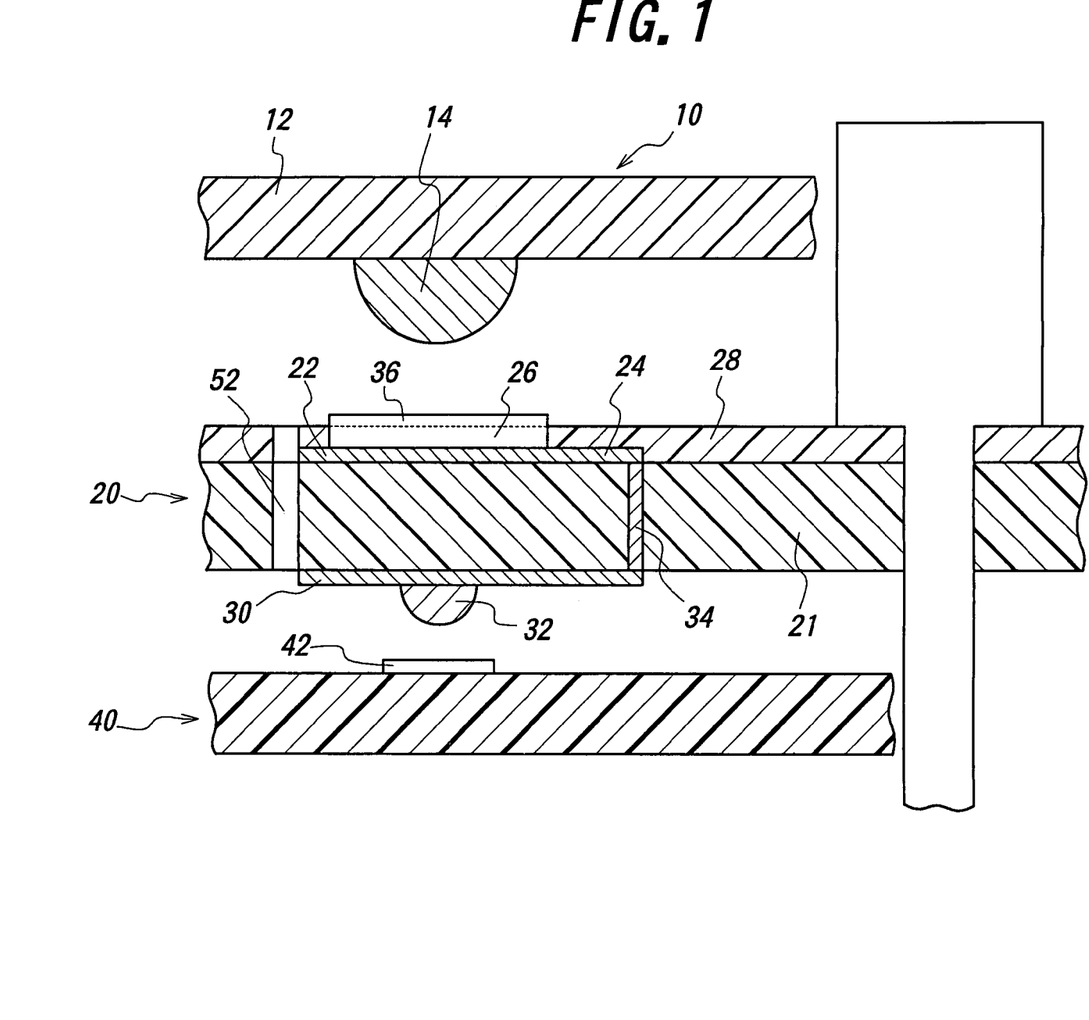
FIG. 1 is a cross-sectional view of the electrical connector with a connector to be inspected.

FIG. 1 illustrates an electrical connector 20 according to one embodiment of the invention. A connector 10 located above the electrical connector 20 viewed in the drawing is in this case first mating electrical means to be inspected for its performance and includes a plurality of electric contacts 14 of solder or the like in the form of hemispherical protrusions provided on one surface of a connector plate 12 of a ceramic or hard resin substrate having a rigidity. The solder of the electric contacts is superior for use in electric contacts, including silver, antimony and the like in addition to lead and tin as solder elements.

The electrical connector 20 according to the invention comprises a substrate or support member 21 having a first circuit 22 on its one surface facing to the connector 10. In forming the first circuit 22, for example, a metal layer such as a copper foil is previously provided on the surface of the support member 21 and then treated as by the printed circuit forming method which is one of the printed circuit board producing techniques to form the first circuit 22 having required conductors. Lead lines 24 to be connected to the first circuit 22 can also be formed by the printed circuit forming method. The material from which to form the first circuit 22 may be any material, insofar as it is highly conductive, preferably, brass, beryllium copper, phosphor bronze or the like.

Provided on the first circuit 22 are a plurality of electric contact elements 26 which are made of a material having a high conductivity and to be brought into contact with the electric contacts 14 of the connector 10. The electrical connector 10 is to be subjected to the inspection for its performance. The electric contact elements 26 are provided on the first circuit 22 as by plating, whose construction will be explained later with reference to FIGS. 3 and 4. A protection covering layer 28 of a synthetic resin is provided on the surface of the support member 21 with the exception of the electric contact elements 26 for protecting the first circuit 22 and the lead lines 24.

Provided on the surface of the support member on the side opposite to the first circuit 22 is a second circuit 30 of required conductors, whose material and the forming method are substantially similar to those of the first circuit 22. The second circuit 30 is provided with a plurality of hemispherical electric contact elements 32 which are brought into contact with pads 42 provided on a substrate 40. The electric contact elements 32 are made of an alloy of gold, nickel, copper or the like. As can be seen from the drawing, there are differences in shape between the electric contact elements 26 to contact the electric contacts 14 of the connector 10 and the electric contact elements 32 to contact the pads 42 on the substrate 40, depending upon the applications.

Conductors 34 are provided for connecting the first and second circuits 22 and 30. Usual lead wires, metal foils or the like may be used for the conductors 34. According to the invention a continuity distance between the electric contact elements 26 and 32 of the electrical connector 20 is less than 5 mm. The term "continuity distance" used herein means an electrically connecting length through a conductor between one electric contact element 26 of the first circuit 22 on one surface of the support member 21 and the corresponding electric contact element 32 of the second circuit 30 on the other surface of the support member 21.

Provided on the substrate 40 mating with the electrical connector 20 as second mating electrical means and located therebelow viewed in the drawing are the pads 42 plated with gold which the electric contact elements 32 contact.

Figure 4:
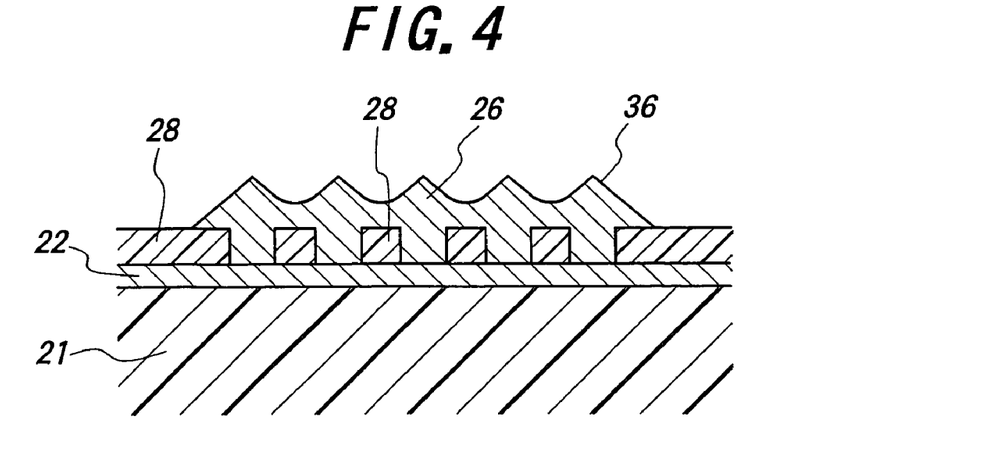
FIG. 4 is a sectional view of the electrical contact element of the electrical connector according to the invention.

When the electric contact elements 26 contact the electric contacts 14 of the connector 10 as first mating electrical means, a small amount of solder of the electric contacts 14 tends to adhere to the electric contact elements 26. In order to remove the adhered solder therefrom, each of the electric contact elements is formed on its surface with at least one ridge 36 having a triangular cross-section, whose crest is preferably somewhat sharp (FIG. 4).

The height of the ridges 36 is of the order of 0.1 mm to 0.2 mm which will sufficient to remove the adhered solder. The number of the ridges 36 is preferably plural in consideration of a positional deviation between the electric contact 14 of the connector 10 and the electric contact element 26 of the electrical connector 20. With a plurality of ridges 36, they form a wave-shaped surface.

When the connector 10 or first mating electrical means to be inspected is urged against the electrical connector 20 to bring the electric contacts 14 into contact with the electric contact elements 26 of the electrical connector 20, the support member 21, or at least parts individually supporting the electric contact elements 26 are elastically deformed downward viewed in FIG. 1. Such a deformation causes the electric contact 14 of the connector 10 to move slidably on the electric contact element 26 of the electrical connector 20, thereby enabling the adhered solder to be removed from the surface of the electric contact element 26.

Figure 2:
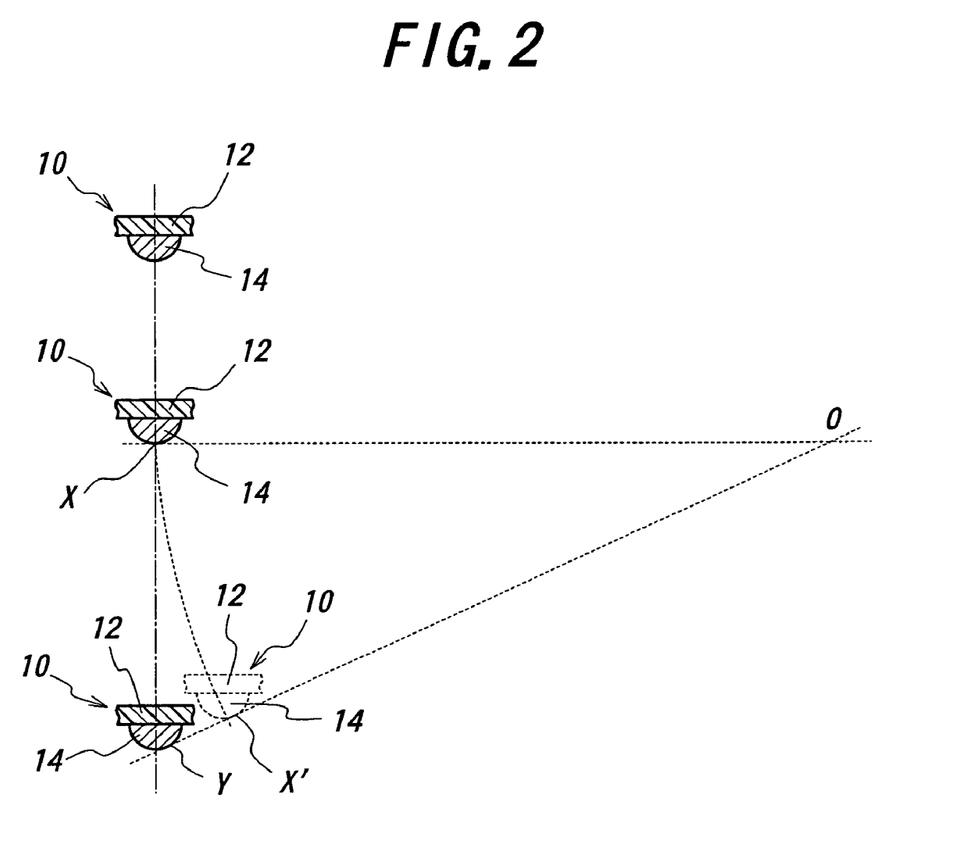
FIG. 2 is a schematic view for explaining the principle of removal of solder adhered to the electric contact element of the electrical connector according to the invention by means of the sliding movement of the mating electric contact on the electric contact element.

The principle of removal of the adhered solder with the deformation will be explained with reference to FIG. 2. When the electric contact 14 of the connector 10 is urged with a constant force against the electric contact element 26 of the electrical connector 20, the electric contact 14 contacts the electric contact element 26 at the position X in FIG. 2. The electric contact 14 is further urged with the constant force against the electric contact element 26 so that the electric contact element 26 is displaced about a fulcrum shown by O in FIG. 2, with the result that the contact point X on the electric contact element 26 moves to the point X. However, as the connector 10 is guided by a socket construction, the electric contact 14 could not move in the horizontal direction, so that the electric contact 14 moves only in the vertical direction. As a result, the electric contact 14 of the connector 10 contacts the electric contact element 26 of the electrical connector 20 at the point Y. Therefore, the electric contact 14 slidably moves on the electric contact element 26 from the point X to the point Y with the constant force so that the adhered solder on the electric contact element 26 can be removed.

Figure 3:
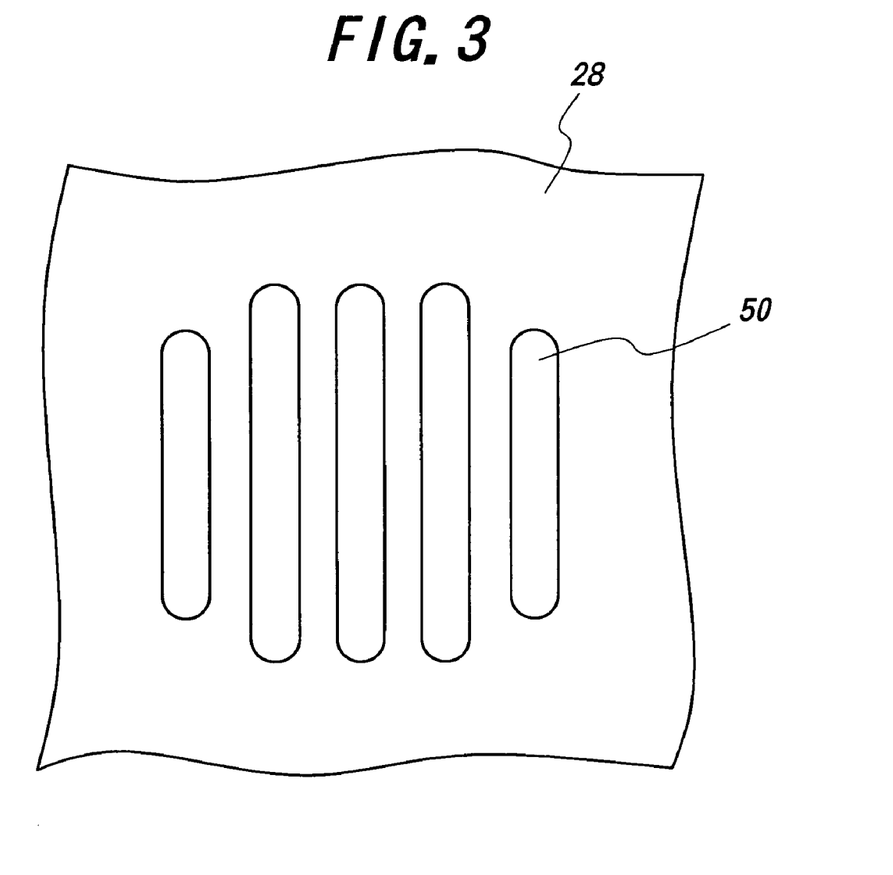
FIG. 3 is a plan view illustrating one step for forming elongated ridges on the electric contact element of the electrical connector according to the invention.

A method for forming the electric contact element 26 having the elongated ridges 36 each having a triangular cross-section of the electrical connector 20 will be explained with reference to FIGS. 3 and 4. First, the protection covering layer 28 is provided all over the first circuit 22. As shown in FIG. 3, at each of locations where the electric contact elements are to be formed, the protection covering layer 28 is formed with at least one slit 50, preferably a plurality of slits 50 extending in parallel with the sliding movement of the electric contact 14 of the connector 10. The slits 50 may be formed by, for example, the laser machining.

Thereafter, the formed slits 50 are progressively plated with the same material as that of the electric contact element 26 to an extent that the slits 50 are filled with the plating metal to form the electric contact element 26. The plating with the plating metal is further carried out to form a plurality of ridges 36 which project higher than the surface of the protection covering layer 28 as shown in FIG. 4. FIG. 4 is a sectional view taken along a plane perpendicular to the plane along which the sectional view of FIG. 1 is taken.

The substrate or support member 21 of the electrical connector 20 will be explained. In order to cause the electric contacts 14 of the connector 10 to slide on the electric contact elements 26 of the electrical connector 20, there is a need for the support member 21 of the electrical connector 20 to be elastically deformed. Therefore, the support member 21 is preferably made of a non-rigid plastic material having an appropriate rigidity such as an elastomeric resin material having a sufficient elasticity. However, without being limited to the resins, a composite body comprising an elastomeric resin material and a metal spring(s) may be used.

Figure 5:
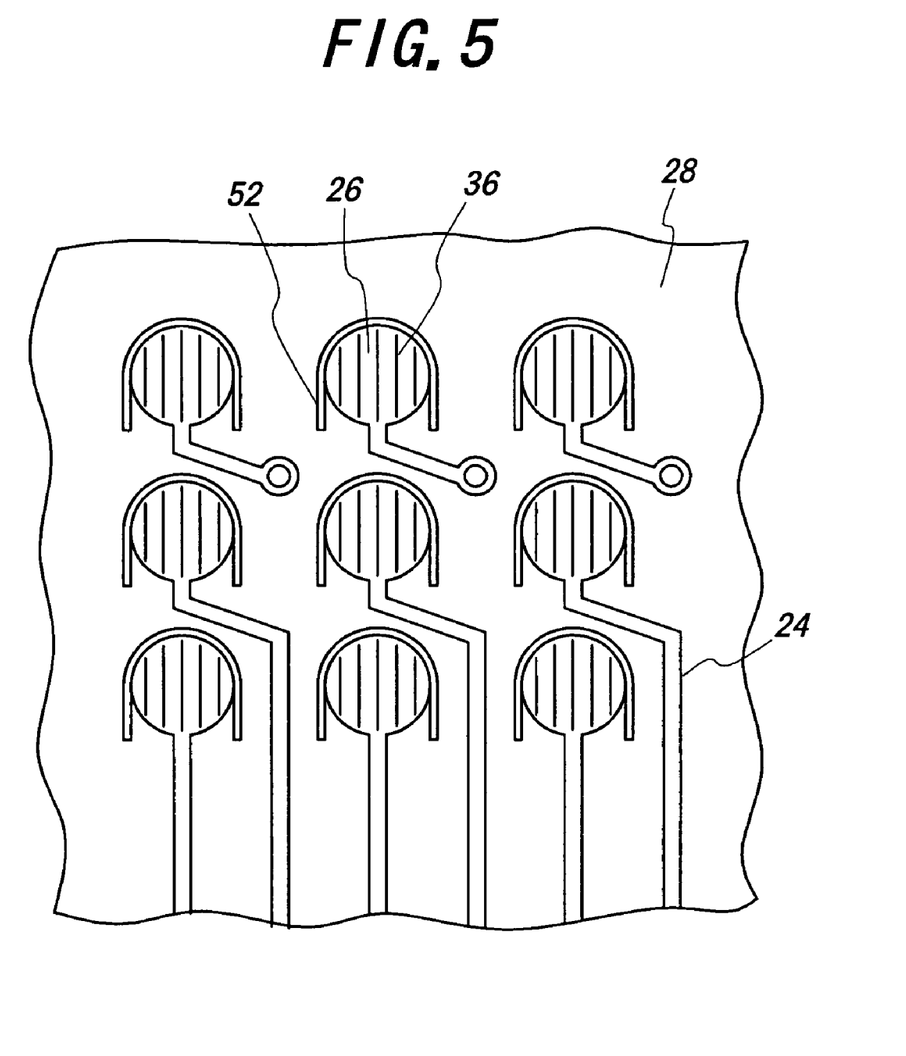
FIG. 5 is a plan view of the electrical connector formed with slits around the electric contact elements formed with ridges according to the invention.

In another embodiment of the invention, as shown in FIGS. 1 and 5 the substrate or support member 21 is formed with inverted U-shaped slits 52 closely around the electric contact elements 26 so that the electric contact elements 26 are supported by the respective U-shaped cantilevers. Therefore, when the electric contacts 14 of the connector 10 urge the electric contact elements 26, they deform to cause the sliding movement of the electric contacts 14 on the electric contact elements 26.

Figure 6:
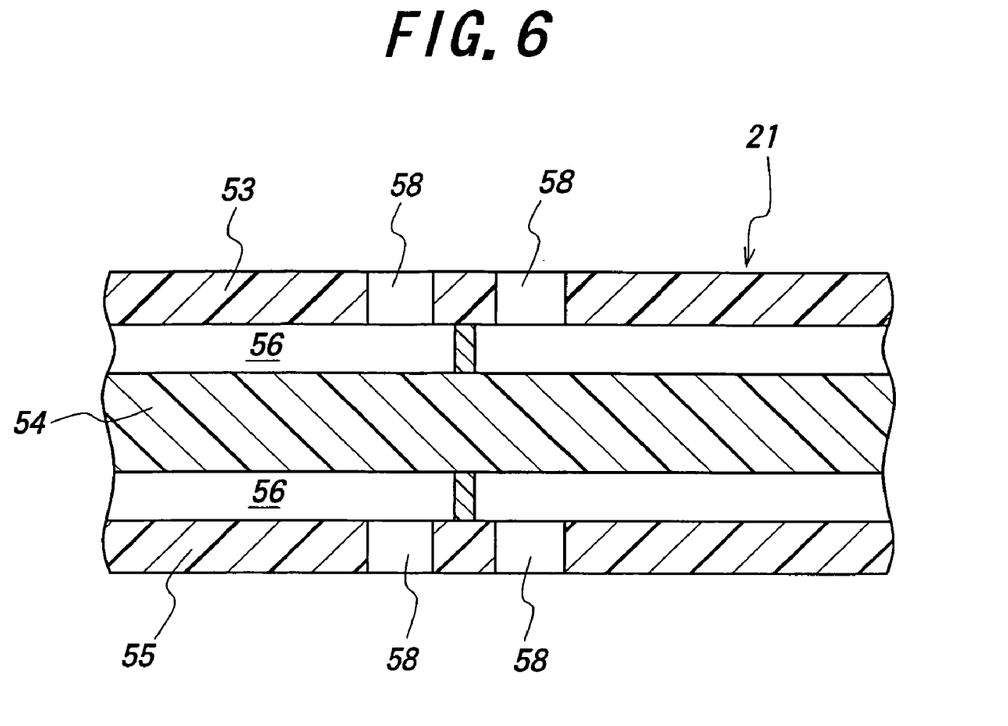
FIG. 6 is a sectional view of the alternatively modified support member of the electrical connector according to the invention.

In a further embodiment of the invention shown in FIG. 6, a support member 21 may be composed of support element members 53, 54 and 55 of, for example, a resin to provide spaces 56 therebetween, thereby increasing the elasticity of the support member 21. As an alternative, a unitary support member 21 may be formed with at least one aperture 56 to increase the elasticity of the support member 21, or the upper and lower support element members 53 and 55 may be formed with at least one aperture 58 substantially perpendicular to the surfaces of the support member 21 to facilitate the deformation of the support member 21.

A preferred method for providing the conductors 34 shown in FIG. 1 will be explained. First, a required number of conductors are extended spaced apart from each other with a predetermined distance and a liquid silicone is poured into the space in which the conductors are extended and is allowed to solidify. The solidified silicone is then sliced in the direction perpendicular to the conductors, and the sliced surface of the silicone is etched by laser so as to permit ends of the conductors to extend from the sliced surface. The ends of the conductors are fitted in apertures provided in metal conductors extending from the electric contact elements of the first and second circuits. After pasty solder is applied to the metal conductors, the conductors extending from the silicon and the metal conductors are firmly connected and fixed to one another by reflow soldering.

Figure 7:
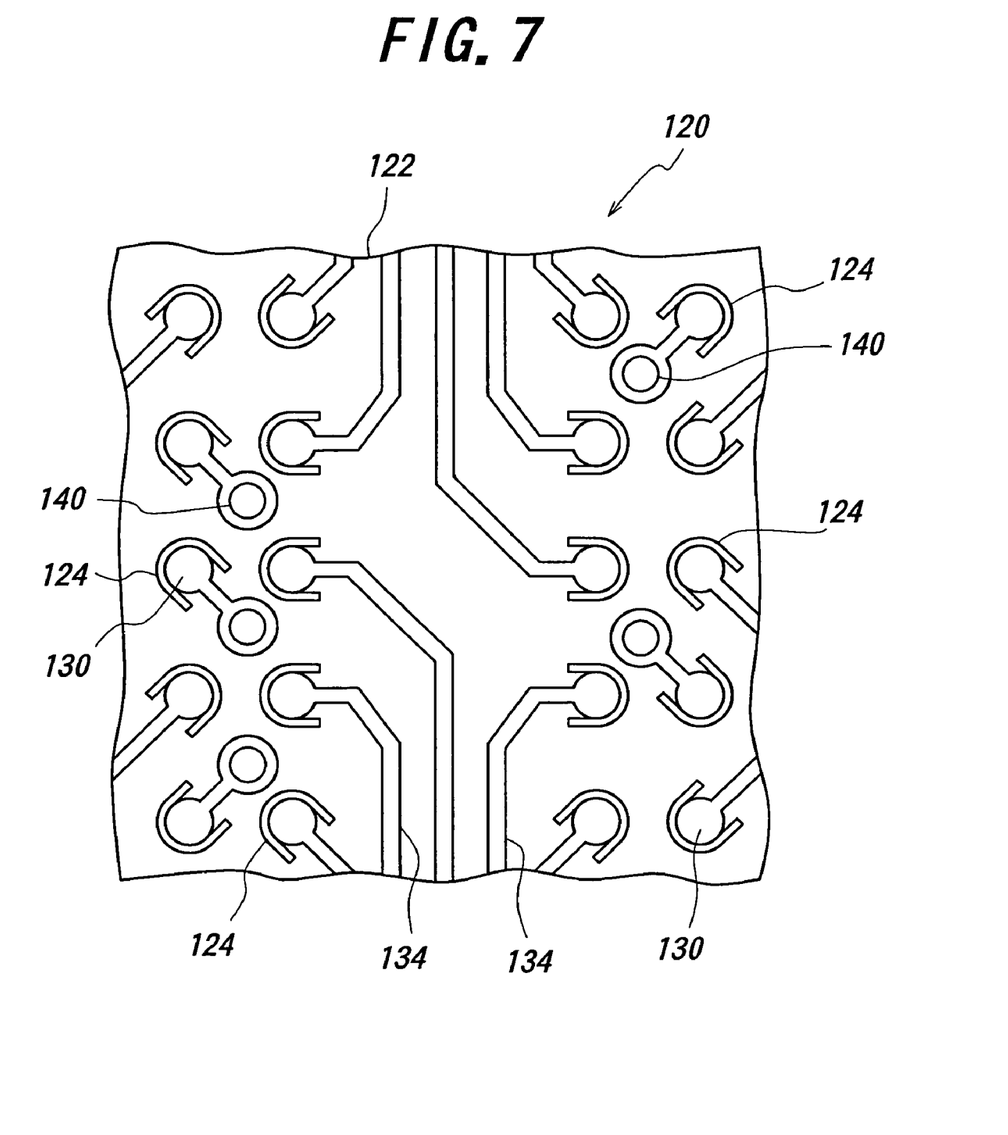
FIG. 7 is a partly enlarged plan view of the substrate of the second connector according to the invention.
Figure 8:
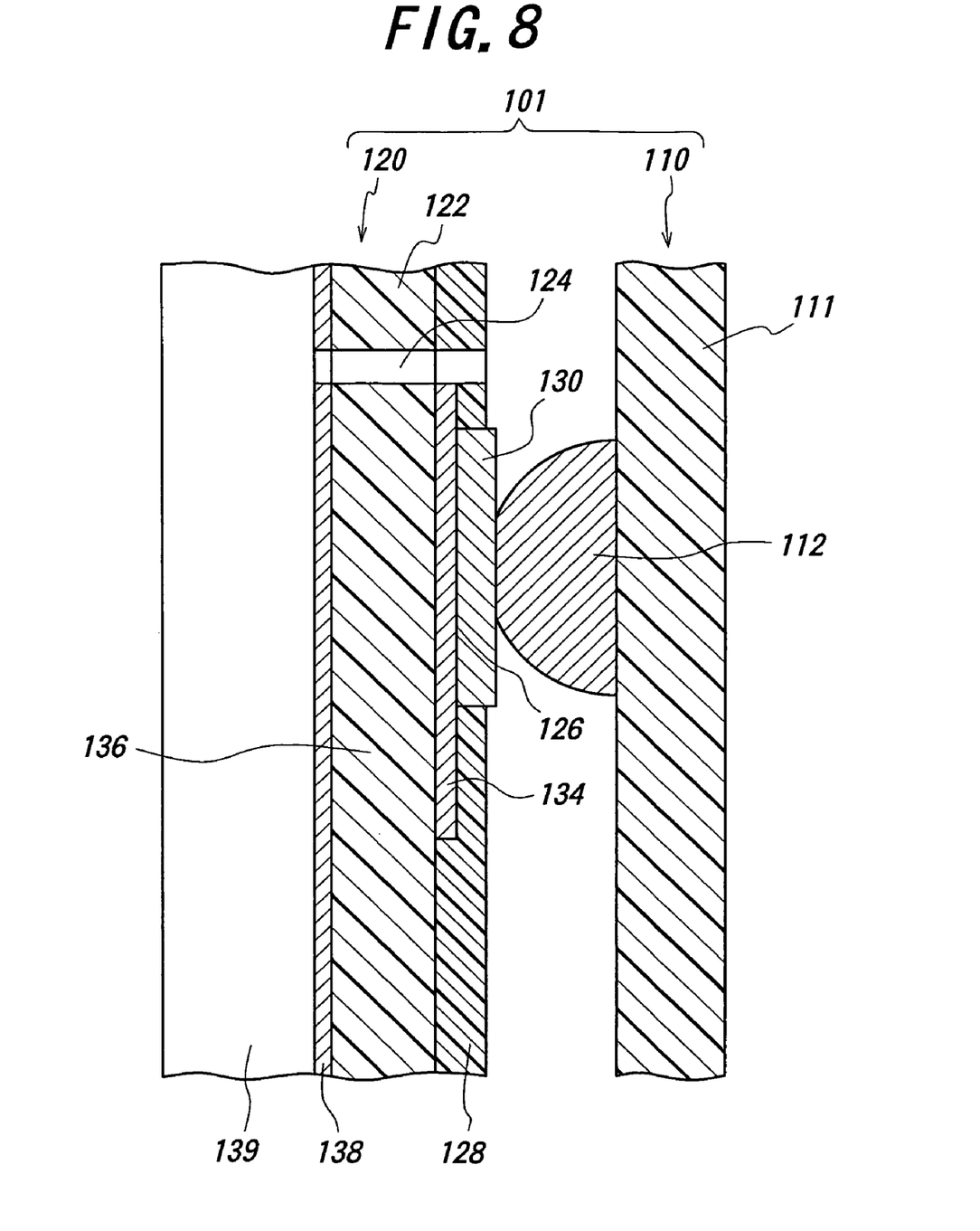
FIG. 8 is a partly enlarged sectional view of the electrical connector according to the invention.

FIGS. 7 to 9 illustrate an electrical connector 120 according to another embodiment of the invention. For the sake of convenience, the connector 120 is referred herein as a second connector and a mating connector 110 is a first connector. In the drawings, a first connector 110 includes a connector plate 111 made of a ceramic or hard resin and a plurality of electric contacts 112 of solder or the like in the form of a hemispherical protrusion provided on one surface of the connector plate 111. A second connector 120 includes a connector plate or substrate or board 122 made of a soft resin or non-rigid plastic material having an appropriate rigidity, a plurality of electric conductors 126 of disc-shaped metal layers on one surface of the board 122 facing to the electric contacts 112 of the first connector 110, electric contact elements 130 provided on the electric conductors 126, and a protection covering layer 128 of an insulating material on the board 122 on the side of the conductors 126. The board 122 together with the protection covering layer 128 is formed with inverted U-shaped slits 124 closely around the electric conductors 126.

The first and second connectors 110 and 120 can be detachably fitted with each other with the aid of a plug and socket mechanism in the conventional manner. Needless to say, on the connector plate 122 on the opposite side of the electric contacts 112 there are provided required wiring such as printed circuits electrically connected to the electric contacts 112 of the first connector 110.

The construction of the second connector 120 will be explained. With the second connector according to this embodiment, the required electric conductors 126 are provided on the one surface of the board 122, for example, by treating a metal layer such as a copper foil previously provided thereon by means of the printed circuit forming method which is one of the board producing techniques as shown in FIG. 8.

The electric contact elements 130 made of a conductive material superior in electric conductivity are provided at locations where the electric conductors 126 electrically contact the electric contacts 112 of the first connector 110. The electric conductors 126 are plated with such a conductive material to form the electric contact elements 130 of the conductive material on the electric conductors 126. The material from which to form the electric conductors 126 may be any material, insofar as it is highly conductive, preferably, brass, beryllium copper, phosphor bronze and the like which have an elasticity. Flexible copper or copper foils may be used for this purpose.

In forming the electric contact element 130 by plating, which is to be in contact with the electric contact 112 of the first connector 110, the electric conductor 126 is first plated with copper, then with nickel, and last with gold.

As described above the substrate 122 of the second connector 120 is formed with the U-shaped slits 124 to support the conductors 126 and the electric contact elements 130 elastically as shown in FIGS. 7 and 8. When the first connector 110 is brought into abutment against the second connector 120 so that the electric contacts 112 of the first connector 110 abut against the electric contact elements 130 of the second connector 120, the electric contact elements 130 compliant in the direction toward and away from the first connector 110 will elastically contact them to keep the stable electrical connection therebetween even if there are some differences of the electric contacts 112 in height. In this manner, the electrical connection between the first and second connectors 110 and 120 is accomplished with high reliability. In this case, as the elasticity for the electric conductors 126 and the electric contact elements 130 depends upon the elasticity of the small tongue-shaped movable pieces 136 formed by the U-shaped slits 124 in the substrate 122, it is required for the substrate 122 of the soft resin or non-rigid plastic material to have a rigidity to an extent such that a sufficient elasticity is given to the small tongue-shaped movable pieces 136.

The arrangement of the slits 124 formed in the substrate 122 will be explained, which is the subject matter of the embodiment. As shown in FIG. 7, the slits 124 are arranged at random to be directed substantially in different directions. In other words, the slits 124 are arranged in a manner such that all the slits 124 are not directed in the same direction. Preferably, more than 70% of the slits 124 are not directed in the same direction. As an alternative, the slits 124 are alternately arranged in a manner that two adjacent slits are alternately directed in opposite directions, or in a manner that two adjacent slits are directed in the same direction and next two adjacent slits in the opposite direction.

With the arrangement of the slits 124 directed in different directions, when the first and second connectors 110 and 120 are being connected to each other, these connectors increase the contacting depths, maintaining the contact starting positions, thereby limiting the sliding distance of the electric contacts 112 of the first connector 110 to a certain distance. Such an effect will be explained in more detail by referring to FIGS. 9A to 9E.

Figure 9A:
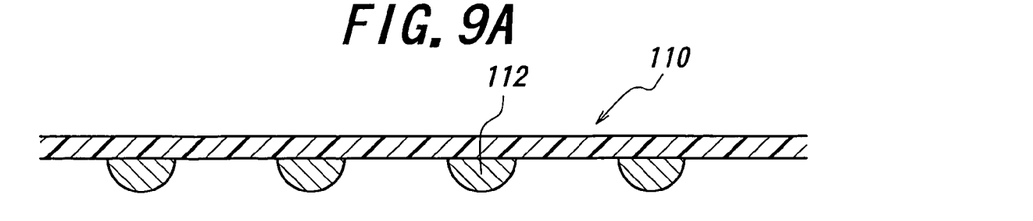
FIG. 9A is a partly enlarged sectional view of the first connector according to the invention.
Figure 9B:
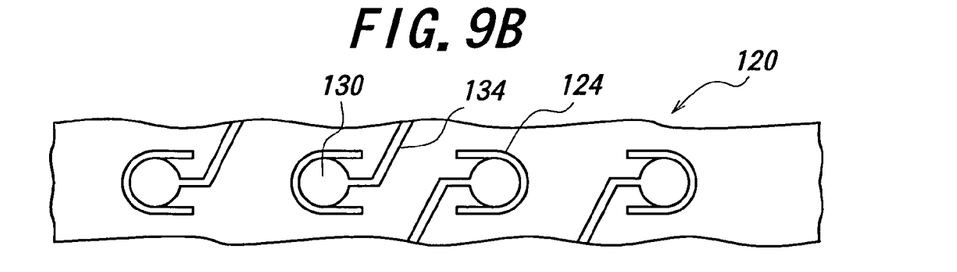
FIG. 9B is a partly enlarged plan view of the second connector according to the invention.
Figure 9C:
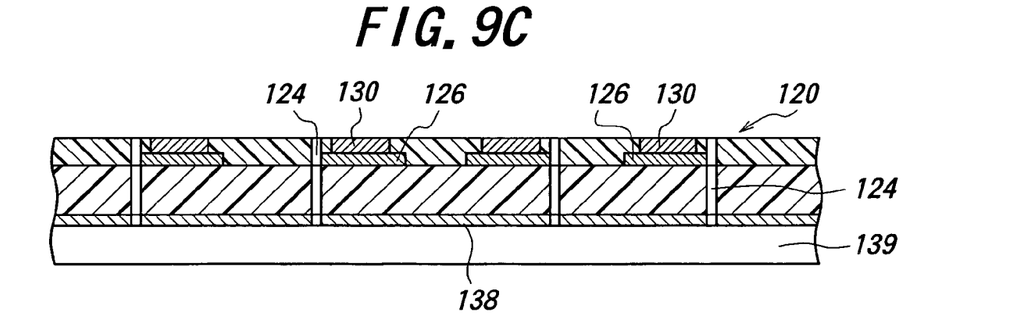
FIG. 9C is a partly enlarged sectional view of the second connector shown in FIG. 9B.
Figure 9D:
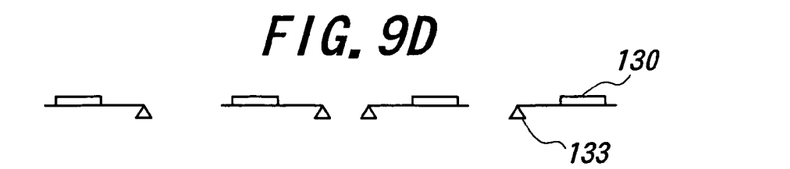
FIG. 9D is a schematic pictorial view of the electric contact elements in FIG. 9C.
Figure 9E:
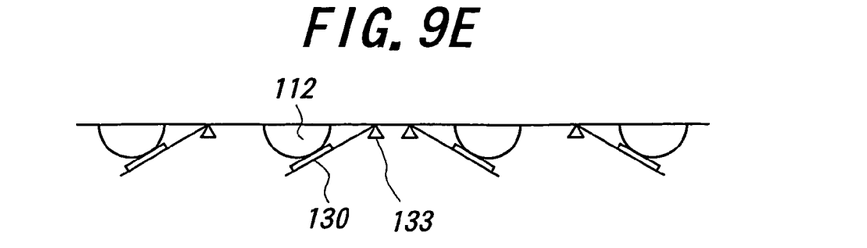
FIG. 9E is a schematic pictorial view illustrating deformed electric contact elements shown in FIG. 9D which have been moved downward by the electric contacts.

FIG. 9A illustrates part of the first connector 110 including four electric contacts, and FIG. 9B shows part of the second connector 120 in opposition to the part of the first connector 110, whose two electric contact elements 130 are directed in the same direction and the remaining two electric contact elements 130 are directed in the opposite direction. FIG. 9C is a cross-sectional view of the part of the second connector 120 shown in FIG. 9B. FIG. 9D schematically illustrates the electric contact elements 130 supported in the cantilevered manner before being urged. FIG. 9E schematically illustrates the electric contact elements 130 urged downward by the electric contacts 112. With the arrangement of the slits 124 directed in the different directions in addition to the guidance of the plug and socket mechanism, horizontal components of the urging forces of the electric contacts 112 of the first connector 110 are canceled out each other so that the center lines of the first and second connectors 110 and 120 are maintained in coincidence with each other without any unstable movement. Accordingly, the sliding distance of the electric contacts 112 on the electric contact elements 130 is limited only to that corresponding to the urged distance of the electric contact elements 130.

While the invention has been particularly shown and described with reference to preferred embodiments thereof, it will be understood by those skilled in the art that the foregoing and other changes in form and details can be made therein without departing from the spirit and scope of the invention.

What is claimed is:

1. An electrical connector for connecting oppositely arranged first and second mating electrical means, comprising a support member made of a non-rigid resin capable of being elastically deformed, a first circuit having a plurality of electric contact elements arranged on one surface of said support member to contact electric contacts of said first mating electrical means, a second circuit having a plurality of electric contact elements arranged on the other surface of said support member to contact electric contacts of said second mating electrical means, and conductors connecting said first and second circuits, wherein said electric contact elements of the first and second circuits are formed in the most suitable manner to meet the shapes of the mating electric contacts, respectively, wherein when said first mating electrical means is a ball grid array connector and said second mating electrical means is a printed circuit board, said electric contact elements of the first circuit are each provided on their surfaces with at least one ridge having a triangular cross-section and said electric contact elements of the second circuit are hemispherical protrusions, thereby making the surfaces of the first and second circuits different in shape, wherein said at least one ridge of each of the electric contact elements of the first circuit is formed to extend in a direction substantially parallel to the direction in which the electric contact of said first mating electrical means slides on the electric contact element upon being displaced in the urged direction by the electric contact when the electric contact contacts and urges the electric contact element in said urged direction, wherein said support member is formed through its thickness with slits closely around said electric contact elements of the first circuit which contact said electric contacts of the first mating electrical means, respectively.

2. The electrical connector as set forth in claim 1, wherein each of said electric contact elements of the first circuit to contact the electric contacts of said first mating electrical means is formed by plating together with the at least one ridge.

3. The electrical connector as set forth in claim 1, wherein said slits are arranged at random to be directed substantially in different directions.

4. The electrical connector as set forth in claim 1, wherein said support member is made of a composite body comprising an elastomeric resin material and a metal spring.

5. The electrical connector as set forth in claim 1, wherein said support member is composed of a plurality of support element members to form spaces therebetween, thereby facilitating the deformation of said support member as a whole.

6. The electrical connector as set forth in claim 1, wherein said support member is formed with at least one aperture parallel to or perpendicular to the surfaces of the support member provided with said first and second circuits, thereby facilitating the deformation of said support member.

7. The electrical connector as set forth in claim 1, wherein "continuity distance" or an electrically connecting length through a conductor between each of said electric contact elements of said first circuit on the one surface of said support member and the corresponding electric contact element of said second circuit on the other surface of said support member is less than 5 mm.

* * * * *